United States Patent [19]

Belouet

[11] Patent Number: 5,276,011
[45] Date of Patent: Jan. 4, 1994

[54] METHOD OF MANUFACTURING A COMPONENT OF THE TAPE OR FILAMENT KIND OUT OF A MATERIAL BASED ON A SUPERCONDUCTING OXIDE HAVING A HIGH CRITICAL TEMPERATURE, AND A COMPONENT OBTAINED THEREBY

[75] Inventor: Christian Belouet, Sceaux, France

[73] Assignee: Alcatel Alsthom Compagnie Generale D'Electricite, Paris, France

[21] Appl. No.: 816,714

[22] Filed: Jan. 3, 1992

[30] Foreign Application Priority Data

Jan. 4, 1991 [FR] France ............... 91 00070

[51] Int. Cl.$^5$ ............................................. C03B 37/00
[52] U.S. Cl. ............................ 505/1; 505/733; 505/727; 505/742; 505/704; 65/2; 65/33; 264/332; 501/95; 501/152; 501/123; 501/126
[58] Field of Search .......... 505/1, 733, 727, 742, 505/704; 65/2, 33; 264/332; 501/95, 136, 123, 126

[56] References Cited

U.S. PATENT DOCUMENTS

| | | | |
|---|---|---|---|
| 4,973,574 | 11/1990 | Nishio et al. | 505/733 |
| 4,975,416 | 12/1990 | Onishi et al. | 505/733 |
| 5,089,468 | 2/1992 | Yoshida et al. | 505/742 |

FOREIGN PATENT DOCUMENTS

| | | | |
|---|---|---|---|
| 0300353 | 1/1989 | European Pat. Off. | H01L 39/24 |
| WO8809312 | 12/1988 | World Int. Prop. O. | C04B 35/50 |

OTHER PUBLICATIONS

Japanese Patent Abstract 2007309, Jan. 11, 1990.
Patent Abstracts of Japan, vol. 14, No. 142 (E-904) Mar. 16, 1990 & JP-A-2 007 309 (Furukawa Electric Co Ltd) Jan. 11, 1990.
Japanese Journal of Applied Physics, vol. 28, No. 4, Apr. 1989, Tokyo, JP, pp. 618-620; Y Morii et al.: "Neutron diffraction study on the crystal orientation of Y-Ba-Cu-O Superconducting material aligned in the magnetic field".

*Primary Examiner*—Mark L. Bell
*Assistant Examiner*—C. M. Bonner
*Attorney, Agent, or Firm*—Sughrue, Mion, Zinn, Macpeak & Seas

[57] ABSTRACT

A method of manufacturing a component of the tape or filament kind out of a material based on a superconducting oxide having a high critical temperature, wherein said material is formed while it is in the vitreous state, the method being characterized by the fact that the material is subsequently crystallized:

in a first step under a magnetic field and at a temperature $T_1$ lying between the vitreous transition temperature $T_g$ and the crystallization temperature $T_x$, during which step isolated microcrystallites of submicroscopic size develop and their c axes orient themselves parallel to one another because of said applied magnetic field; and in a second step at a temperature $T_2$ close to the crystallization temperature, in which the existing nuclei grow while retaining the texture imparted to them during said first step.

7 Claims, No Drawings

METHOD OF MANUFACTURING A COMPONENT OF THE TAPE OR FILAMENT KIND OUT OF A MATERIAL BASED ON A SUPERCONDUCTING OXIDE HAVING A HIGH CRITICAL TEMPERATURE, AND A COMPONENT OBTAINED THEREBY

The present invention relates to a method of manufacturing a component of the tape or filament kind out of a material based on a superconducting oxide having a high critical temperature.

Superconducting oxides are compounds having highly anisotropic properties. Thus, the critical current density Jc in planes perpendicular to the $\bar{c}$ direction of the crystal lattice is two orders of magnitude greater than that measured in the $\bar{c}$ direction. This effect is further amplified in the presence of a magnetic field. The use of such materials in high current applications requires values of Jc at 77 K greater than $10^4$ A/cm$^2$, if possible in high magnetic fields, e.g. of a few Teslas, depending on the application.

At present, these materials are prepared using the methods of ceramics technology (pressing and sintering), or by directed solidification and crystallization of vitreous matrices. It is known that high critical temperature superconducting oxide compositions lend themselves to vitrification. Going through the vitreous phase makes direct forming possible using glassmaking techniques close to those developed for glasses that contain fluorine. Thus, direct manufacture of vitreous tapes of the compound $Bi_2Sr_2CaCu_2O_8$ by a technique of quenching on a cooled roller has already been demonstrated.

However, until now it has not been possible to make a tape or a filament with a textured material, i.e. made up of crystallites whose $\bar{c}$ axis is common and orthogona to the current propagation direction.

An object of the present invention is to make tapes or filaments in which the high critical temperature superconducting oxide is textured.

The present invention provides a method of manufacturing a component of the tape or filament kind out of a material based on a superconducting oxide having a high critical temperature, wherein said material is formed while it is in the vitreous state,
the method being characterized by the fact that the material is subsequently crystallized:

in a first step under a magnetic field and at a temperature $T_l$ lying between the vitreous transition temperature $T_g$ and the crystallization temperature $T_x$, during which step isolated microcrystallites of submicroscopic size develop and their $\bar{c}$ axes orient themselves parallel to one another because of said applied magnetic field; and in a second step at a temperature $T_2$ close to the crystallization temperature, in which the existing nuclei grow while retaining the texture imparted to them during said first step.

The said second step may be performed with or without said magnetic field.

The said magnetic field is applied perpendicularly to the main faces of the tape, or perpendicularly to the long direction of the filaments, and its value is in the range of about 1 to 9 Teslas.

Numerous high temperature superconducting compositions lend themselves to vitrification and may be formed by glassmaking techniques analogous to those that have been developed for glasses that contain fluorine. Thus, it is possible to make a selection from the generic families of superconducting oxide compounds based on lanthanum LaSrCuO, based on yttrium including $YBa_2Cu_3O_7$ and $Y_2Ba_4Cu_8O_{16}$, based on bismuth including $Bi_2Sr_2CaCu_2O_8$ and $Bi_2Sr_2Ca_2Cu_3O_{10}$, and based on thallium, including $Tl_2Ba_2Ca_2Cu_3O_{10}$.

It is also possible to select from the following substituted compounds: $EuBa_2Cu_3O_7$, $HoBa_2Cu_3O_7$, $Bi_{2-x}Pb_xSr_2CaCu_2O_8$ and $Bi_{2-x}Pb_xSr_2Ca_2Cu_3O_{10}$, with $0 < x \leq 0.4$ The temperature $T_l$ is thus such that:

the viscosity of the vitreous material is low enough to enable the microcrystallites to be directed; and the phenomenon of nucleation-growth takes place sufficiently rapidly.

With reference to the direction of the $\bar{c}$ axis relative to the magnetic field, it is known that microcrystallites align their direction of strongest magnetization parallel to the magnetic field (cf. article by D.E. Farrell et al. published in Phys. Rev. B 36 (1987) 4025). It happens that the magnetic susceptibility tensor X of the material concerned is determined by two main values $\chi(\parallel \bar{c})$ and $\chi(\perp \bar{c})$. The monocrystallites will have all of their $\bar{c}$ axes parallel to one another and to the magnetic field direction if $\chi(\parallel \bar{c})$ is greater than $\chi(\perp \bar{c})$. They will have all of their $\bar{c}$ axes parallel to one another and perpendicular to the direction of the magnetic field if $\chi(\parallel \bar{c})$ is less than $\chi(\perp \bar{c})$.

The ratio of $\chi(\parallel \bar{c})/\chi(\perp \bar{c})$ depends on the superconducting oxide under consideration.

The method of the invention thus makes it easy to form a tape or a filament by using vitreous precursors. Thereafter, by monitoring nucleation in a magnetic field, it makes it possible to develop primary crystallites that can be oriented because of the relatively low viscosity of glass at high temperature. These primary crystallites are the source of the high degree of texture in the material which is fully crystallized in the second step, where their growth is developed at a temperature close to the $T_x$ temperature of the glass.

These operations of shaping and of imparting a high degree of texture are thus made compatible during the implementation of the method of the invention.

Other characteristics and advantages of the present invention appear from the following description of a particular implementation given by way of non-limiting illustration.

A tape is available of vitreous material having the composition $Bi_{1.6}Pb_{0.4}Sr_2Ca_2Cu_3O_{10}$ obtained by the technique of quenching between two rollers. The width of the tape is 2 cm and its thickness is 50 μm. Its vitreous transition temperature $T_g$ is 577 K. and its crystallization temperature $T_x$ is 724 K. For this material: $\chi(\parallel \bar{c})$ is much greater than $\chi(\perp \bar{c})$.

The tape is caused to run through an open tubular oven in which it is raised to the temperature $T_l = 680$ K. A magnetic field H of about 1 Tesla is applied perpendicularly to the main face of the tape. During this first step, primary crystallites are induced by the nucleation-growth process in the glass, and the primary crystallites are oriented by rotating in the viscous glass. Under the effect of the field H, the $\bar{c}$ axis becomes parallel to the direction of said field H. During the second step, the tape runs through a second tubular oven in which it is raised to the temperature $T_2 = 730$ K. The magnetic field may be maintained during this stage in order to retain the initial orientation of the crystallites, but that is not essential.

At this temperature which is slightly greater than $T_x$, nucleation is low and the growth of the existing crystallites is fast. The material of the tape is thus transformed into a highly textured polycrystalline material, with the crystallites having their $CuO_2$ planes parallel to the plane of the tape, i.e. parallel to the current to be passed therealong.

The method described above can be implemented analogously with a glass filament obtained by fiber-drawing a preform, itself made in the same way as preforms of glasses that contain fluorine.

In some applications, the tape (or filament) is wound on its final support between the first and second steps at a temperature $T_3$ lying between $T_g$ and $T_l$ so as to take advantage of the flexibility of the material which is still essentially vitreous at this stage. Naturally, this is only possible if the support can itself withstand the conditions of the second step of the method without being damaged (by the temperature or possibly by the magnetic field).

If the treatment times during the two steps of the method at the temperatures $T_l$ and $T_2$ are compatible, then the method can be run continuously.

Naturally the invention is not limited to the implementations mentioned above. Without going beyond the scope of the invention, any means may be replaced by equivalent means.

I claim:

1. A method of manufacturing a component of a tape or filament of a superconducting oxide material having a high critical temperature, said method comprising the steps in sequence of:

forming said material component while said material is in a vitreous state, and subsequently crystallizing said material:

firstly, under a magnetic field and at a temperature $T_1$ lying between the vitreous transition temperature $T_g$ and the crystallization temperature $T_x$ of said material, such that isolated microcrystallites of submicroscopic size develop and $\bar{c}$ axes thereof orient themselves parallel to one another because of said applied magnetic field; and secondly, at a temperature $T_2$ close to the crystallization temperature of said material, whereby existing nuclei thereof grow while retaining the texture imparted to the nuclei during said first crystallization step.

wherein between said first and second crystallization steps, said component is wound onto a final support at a temperature $T_3$ lying between $T_g$ and $T_1$.

2. A manufacturing method according to claim 1, wherein the value of said applied magnetic field is in the range of 1 to 9 Tesla.

3. A manufacturing method according to claim 2, wherein said material is formed in the vitreous state into a tape having opposite main faces, and said method further comprises applying said magnetic field perpendicularly to the main faces of said tape.

4. A manufacturing method according to claim 2, wherein said material in the vitreous state is formed into a filament and said magnetic field is applied perpendicularly to a long direction of said filament.

5. A manufacturing method according to claim 1, wherein said magnetic field is maintained during said second crystallization step at said temperature $T_2$.

6. A method of manufacturing a component according to claim 1, wherein said superconducting oxide material is one selected from the group consisting of compounds based on lanthanum including $LaSrCuO$, based on yttrium including $YBa_2Cu_3O_7$ and $Y_2Ba_4Cu_8O_{16}$, based on bismuth, including $Bi_2Sr_2CaCu_2O_8$ and $Bi_2Sr_2Ca_2Cu_3O_{10}$, and based on thallium including $Tl_2Ba_2Ca_2Cu_3O_{10}$.

7. A method of manufacturing a component according to claim 1, wherein said superconducting oxide is one compound selected from the group consisting of $EuBa_2Cu_3O_7$, $HoBa_2Cu_3O_7$, $Bi_{2-x}Pb_xSr_2CaCu_2O_8$ and $Bi_{2-x}Pb_xSr_2Ca_2Cu_3O_{10}$ with $0 < X \leq 0.4$.

* * * * *